US011532338B1

(12) United States Patent
Eliaz et al.

(10) Patent No.: US 11,532,338 B1
(45) Date of Patent: Dec. 20, 2022

(54) MEDIATING BETWEEN ASYNCHRONOUS CLOCK DOMAINS WHILE PREVENTING FALSE INDICATIONS OF FIFO OCCUPANCY

(71) Applicant: HABANA LABS LTD., Caesarea (IL)

(72) Inventors: Ehud Eliaz, Tel Aviv (IL); Yamin Mokatren, Um El Gnam Shibli (IL)

(73) Assignee: HABANA LABS LTD., Caesarea (IL)

( * ) Notice: Subject to any disclaimer, the term of this patent is extended or adjusted under 35 U.S.C. 154(b) by 73 days.

(21) Appl. No.: 17/223,042

(22) Filed: Apr. 6, 2021

(51) Int. Cl.
  *G11C 7/22* (2006.01)
  *G11C 7/10* (2006.01)
  *G06F 13/16* (2006.01)

(52) U.S. Cl.
  CPC .......... *G11C 7/225* (2013.01); *G06F 13/1689* (2013.01); *G11C 7/222* (2013.01); *G11C 7/1072* (2013.01)

(58) Field of Classification Search
  CPC ....... G11C 7/225; G11C 7/222; G11C 7/1072; G11C 11/4076; G11C 11/4093; G11C 11/4096; G06F 13/1689; G06F 13/1673; G06F 1/12; G06F 13/42; G06F 13/38
  See application file for complete search history.

(56) References Cited

U.S. PATENT DOCUMENTS

| 5,781,802 A | 7/1998 | Cassetti |
| 5,894,567 A | 4/1999 | Dodd et al. |
| 6,762,974 B1 | 7/2004 | Johnson et al. |
| 6,907,541 B1 * | 6/2005 | Padmanabhan ........... G06F 1/04 370/503 |
| 7,254,677 B1 * | 8/2007 | Lowe ........................ G06F 5/10 710/52 |
| 7,404,018 B2 | 7/2008 | Dietrich et al. |
| 7,500,044 B2 | 3/2009 | Wang et al. |

(Continued)

FOREIGN PATENT DOCUMENTS

| WO | 2020172871 A1 | 9/2020 |
| WO | 2021068011 A1 | 4/2021 |

OTHER PUBLICATIONS

Cummings, "Simulation and Synthesis Techniques for Asynchronous FIFO Design", SNUG Conference Paper, Rev. 1.2, Sunburst Design, San Jose, USA, pp. 1-23, year 2002.

(Continued)

*Primary Examiner* — Ajay Ojha
(74) *Attorney, Agent, or Firm* — Kligler & Associates Patent Attorneys Ltd

(57) ABSTRACT

An electronic circuit includes a memory buffer and control logic. The memory buffer is configured to transfer data from a first domain to a second domain of the circuit, the first and the second domains operate in synchronization with respective clock signals. The control logic is configured to maintain a write indicator in the first domain indicative of a next write position in the memory buffer for storing data, to maintain a read indicator in the second domain indicative of a next read position in the memory buffer for retrieving the stored data, to generate in the second domain, based on the write and the read indicators, a first signal that is indicative of whether the memory buffer has data for reading or has become empty, and retain the first signal in a state that indicates that the memory buffer has become empty, until writing to the memory buffer resumes.

26 Claims, 5 Drawing Sheets

(56) References Cited

U.S. PATENT DOCUMENTS

| | | | |
|---|---|---|---|
| 7,668,272 | B1 | 2/2010 | Obeidat |
| 7,925,803 | B2 | 4/2011 | Mangano et al. |
| 8,234,422 | B2 | 7/2012 | Linam et al. |
| 8,352,774 | B2 | 1/2013 | Elrabaa |
| 8,930,664 | B2 | 1/2015 | Kulmala et al. |
| 9,330,740 | B1 | 5/2016 | Baeckler et al. |
| 9,430,418 | B2 | 8/2016 | Meaney et al. |
| 10,027,433 | B2 | 7/2018 | Philip et al. |
| 10,048,893 | B2 * | 8/2018 | Goikhman ............ G06F 3/0688 |
| 2010/0322365 | A1 | 12/2010 | Dobkin et al. |
| 2015/0026494 | A1 | 1/2015 | Bainbridge et al. |
| 2019/0212769 | A1 * | 7/2019 | Carlough ................ H03L 7/085 |

OTHER PUBLICATIONS

Cummings et al., "Simulation and Synthesis Techniques for Asynchronous FIFO Design with Asynchronous Pointer Comparisons", SNUG Conference Paper, Rev 1.2, Sunburst Design, San Jose, USA, pp. 1-18, year 2002.

Verbitsky et al., "A Four-Stage Mesochronous Synchronizer with Back-Presssure and Buffering for Short and Long Range Communications", Research Paper, VLSI Systems Research Center, EE Department, Technion, Haifa, Israel, pp. 1-16, year 2011.

Zhang et al., "Link circuits and architecture", High Speed Digital Design, Chapter 4, pp. 163-198, year 2015.

U.S. Appl. No. 17/364,902 Office Action dated Jun. 13, 2022.

* cited by examiner

MEDIATING BETWEEN ASYNCHRONOUS CLOCK DOMAINS WHILE PREVENTING FALSE INDICATIONS OF FIFO OCCUPANCY

TECHNICAL FIELD

Embodiments described herein relate generally to digital circuit design, and particularly to methods and systems for mediating between asynchronous clock domains.

BACKGROUND

Complex Integrated Circuits (ICs) such as Systems-on-Chip (SoC) are often partitioned into multiple clock domains. In practice, it is sometimes necessary to transfer signals and data from one clock domain to another. Various techniques for clock-domain crossing are known in the art. Example Clock-Domain Crossing (CDC) techniques are described, for example, in a paper by Sunburst Design, entitled "Simulation and Synthesis Techniques for Asynchronous FIFO Design," revision 1.1, April 2002. The paper describes FIFOs that are used to safely pass data from one clock domain to another asynchronous clock domain, and a method that is used to design, synthesize and analyze a safe FIFO between different clock domains using Gray code pointers that are synchronized into a different clock domain before testing for "FIFO full" or "FIFO empty" conditions.

SUMMARY

An embodiment that is described herein provides an electronic circuit that includes a memory buffer and control logic. The memory buffer is configured to transfer data from a first domain of the circuit to a second domain of the circuit, the first and the second domains operate in synchronization with respective first and second clock signals. The control logic is configured to maintain a write indicator in the first domain indicative of a next write position in the memory buffer for storing data, to maintain a read indicator in the second domain indicative of a next read position in the memory buffer for retrieving the stored data to generate in the second domain, based at least on the write indicator and on the read indicator, a first signal that is indicative of whether the memory buffer has data for reading or has become empty, and retain the first signal in a state that indicates that the memory buffer has become empty, until writing to the memory buffer resumes.

In some embodiments, the control logic is configured to retain the first signal in the state that indicates that the memory buffer has become empty, regardless of a first event including resetting the first domain including the write indicator and of a second event including resetting the second domain including the read indicator. In other embodiments, the control logic is configured to prevent a false indication of the first signal that the memory buffer is not empty even when the memory buffer is actually empty. In yet other embodiments, the control logic is configured to prevent the false indication regardless of any backend design considerations in determining a physical layout of reset signals in the electronic circuit.

In an embodiment, the control logic is configured to prevent the false indication by resetting both the first domain and the second domain simultaneously. In another embodiment, the control logic is configured to prevent the false indication regardless of a timing skew between a first time of actual resetting of the first domain and a second time of actual resetting of the second domain. In yet another embodiment, the control logic is configured to generate in the second domain, a second signal that falsely indicates that the memory buffer being not empty, and to mask the second signal using the first signal.

In some embodiments, the control logic is configured to generate the first signal using a storage element in the first domain, by forcing the storage element to a state indicative of the memory buffer being empty, in response to resetting the first domain, and determining a state of the storage element when the first domain is operative, based on (i) tracking write operations to the memory buffer, and (ii) the write indicator and the read indicator. In other embodiments, the read indicator includes multiple binary storage elements, and the control logic is configured to toggle only one of the binary storage elements in response to a read operation from the memory buffer. In yet other embodiments, the write indicator includes multiple binary storage elements, and the control logic is configured to toggle only one of the binary storage elements in response to a write operation to the memory buffer.

In an embodiment, the first clock signal and the second clock signal are asynchronous relative to one another.

There is additionally provided, in accordance with an embodiment that is described herein, a method, including, in an electronic circuit that transfers data from a first domain of the circuit to a second domain of the circuit using a memory buffer, the first and the second domains operate in synchronization with respective first and second clock signals, maintaining in the first domain a write indicator indicative of a next write position in the memory buffer for storing data, and maintaining in the second domain a read indicator indicative of a next read position in the memory buffer for retrieving the stored data. A first signal is generated in the second domain, based at least on the write indicator and on the read indicator, the first signal is indicative of whether the memory buffer has data for reading or has become empty. The first signal is retained in a state that indicates that the memory buffer has become empty, until writing to the memory buffer resumes.

These and other embodiments will be more fully understood from the following detailed description of the embodiments thereof, taken together with the drawings in which:

DETAILED DESCRIPTION OF EMBODIMENTS

Overview

Figure 1:
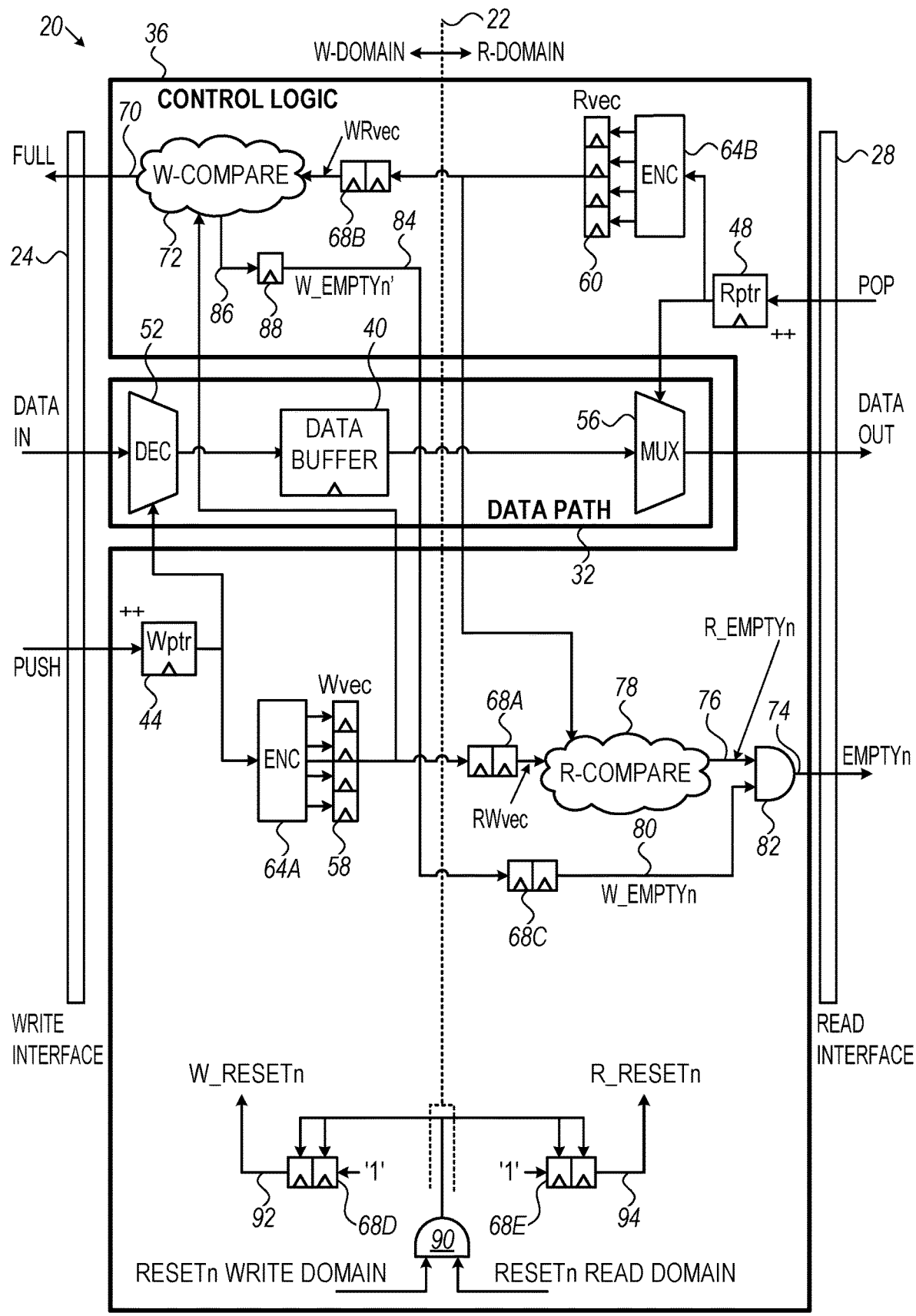
FIG. 1 is a block diagram that schematically illustrates a domain-crossing circuit, in accordance with an embodiment that is described herein.

Embodiments that are described herein, provide methods and circuits for preventing false FIFO-occupancy indications in a Clock-Domain-Crossing (CDC) circuit.

In some embodiments, a CDC circuit is used for transferring data from one clock domain to another clock domain of an IC or a System on chip (SoC). The term "clock domain" is also referred to herein simply as "domain" for brevity.

In some embodiments, an electronic circuit implementing a CDC comprises a memory buffer that transfers data from a first domain of the circuit to a second domain of the circuit. The memory buffer is written and read as a First-In First-Out (FIFO) buffer. The first and the second domains operate in synchronization with different respective first and second clock signals of the domains. The disclosed embodiments are applicable to circuits in which the first clock signal and the second clock signal are asynchronous relative to one another.

The first domain in which the memory buffer is written is also referred to as a "write domain," whereas the second domain in which the memory buffer is read is also referred to herein as a "read domain."

The electronic circuit comprises control logic that maintains in the first domain a write indicator indicative of a next write position in the memory buffer for storing data. The control logic further maintains in the read domain a read indicator indicative of a next read position in the memory buffer for retrieving data stored in the memory buffer. In some embodiments, the write indicator and the read indicator are derived from a write pointer and a read pointer that point to respective next write and next read positions in the memory buffer.

The control logic manages write and read operations to and from the memory buffer, using a "FULL" indication in the write domain and an "EMPTY" indication in the read domain. The FULL and EMPTY indications are generated based on the write and read indicators. For example, the memory buffer is considered empty after applying to the memory buffer the same number of write (push) and read (pop) operations. Note that the read indicator of the read domain is synchronized to the write domain for generating a FULL indication, and the write indicator of the write domain is synchronized to the read domain to generate an EMPTY indication.

In some embodiments, the electronic circuit comprises separate reset signals for resetting the write and read domains. The separate reset signals may be asserted independently of one another. Typically, before asserting a reset signal to one of the domains, software that controls the chip validates that the memory buffer is empty. In some applications, the chip is required to support resetting each of the write and read domains separately. In other applications, individual reset of each domain is unsupported, and the software needs to reset both domains simultaneously. In some embodiments, the individual reset signals are combined to produce a common reset signal so that both domains are reset simultaneously. Due to backend processing and timing relaxations usually done on the reset signal, which determines the layout of the electronic circuit, the reset signal may propagate differently in the write and read domains, causing some timing skew between the actual reset times in the write and read domains. Such a timing skew may result in a false indication of the memory buffer occupancy, as described herein.

At initialization, the write and read domains are reset causing both the write pointer and the read pointer to point to the first position in the memory buffer. After applying a given number of write operations to the memory buffer and a same number of read operations from the memory buffer, the memory buffer is empty and the write and the read pointers point to a common position in the memory buffer, which in general may be different from the first position. If at this point the write domain is reset before the read domain, the write pointer will be reset to the first position some time before the read pointer does.

Consequently, the control logic will generate a false indication that the memory buffer is not empty, which may result in reading invalid data from the memory buffer. This undesirable condition may persist until the read pointer becomes equal to the write pointer. Another scenario in which the empty indication may falsely indicate that the memory buffer is not empty may occur when a reset signal is asserted and released in the read domain before reset is asserted to the write domain.

In the disclosed techniques, the control logic prevents false indications of the memory buffer being not empty. To this end, the control logic forces an empty indication in response to detecting that all data written to the memory buffer has been read, as described herein.

In some embodiments, the control logic generates in the read domain, based at least on the write indicator and on the read indicator, a first signal that is indicative of whether the memory buffer has data for reading or has become empty. The control logic holds the first signal in a state that indicates that the memory buffer has become empty, until writing to the memory buffer resumes. The control logic thus prevents a false indication of the first signal that the memory buffer is not empty when the memory buffer is actually empty.

In some embodiments, the control logic prevents the false indication regardless of any backend design considerations in determining the physical layout of the reset signals in the electronic circuit. In one approach, to prevent the false indication, the control logic resets both the write domain and the read domain simultaneously. As will be described in detail below, the control logic prevents the false indication regardless of a timing skew between a first time of actual resetting of the write domain and a second time of actual resetting of the read domain.

In some embodiments, the control logic is configured to generate, in the read domain, a second signal that is falsely indicative of the memory buffer being not empty, and to mask the second signal using the first signal. The control logic generates the first signal using a storage element in the write domain, by forcing the storage element to a state indicative of the memory buffer being empty, in response to resetting the write domain, and determining a state of the storage element when the write domain is operative, based on (i) tracking push operations to the memory buffer, and (ii) the write indicator and the read indicator.

In some embodiments, the read indicator comprises multiple binary storage elements, and the control logic toggles only one of the binary storage elements in response to a read operation from the memory buffer. Similarly, the write indicator comprises multiple binary storage elements, and the control logic toggles only one of the binary storage elements in response to a write operation to the memory buffer. Read and write indicators of this sort are transferred and synchronized reliably to the opposite domain.

In the disclosed techniques the control logic forces an empty indication in response to the memory buffer becoming empty, regardless of reset signals applied to the clock domains, thus preventing false indication of the memory buffer occupancy, which prevents reading invalid data. This scheme does not interfere with regular data transfer from the write domain to the read domain.

System Description

FIG. 1 is a block diagram that schematically illustrates a domain-crossing circuit 20, in accordance with an embodiment that is described herein. Domain-crossing circuit 20 may be implemented in any suitable circuit or system, such as in an IC or SoC.

Domain-crossing circuit 20 is used for transferring data from a first domain denoted "write domain" or "W-domain," to a second domain denoted "read domain" or "R-domain." The W-domain and the R-domain correspond to different clock domains. This means that elements within the W-domain operate in synchronization with a W-domain clock, and elements of the R-domain operate in synchronization with a different R-domain clock. In FIG. 1 the W-domain and R-domain are separated by a vertical dotted line 22.

Domain-crossing circuit 20 comprises a write interface 24 for receiving data to be transferred, a read interface 28 for outputting the data transferred, a data path 32, and control logic 36.

Data path 32 comprises, in the W-domain, a data buffer 40 operating as a First-In First-Out (FIFO) buffer. Data buffer 40 is also referred to herein as a "memory buffer." The data path receives via the write interface data (denoted DATA IN), and writes the received data into memory buffer 40, in synchronization with the clock of the W-domain. The data path reads data stored in memory buffer 40, in synchronization with the clock of the R-domain, and outputs the read data (denoted DATA OUT) via the read interface.

Memory buffer 40 may be implemented using any suitable type of storage, e.g., a Random-Access Memory (RAM) or a plurality of registers.

Control logic 36 maintains in the W-domain a write pointer 44 (denoted Wptr in the figure) and maintains in the R-domain a read pointer 48 (denoted Rptr in the figure). The pointers Wptr and Rptr point to (or are indicative of) the next write position and the next read position in memory buffer 40, respectively. The pointers Wptr and Rptr may be implemented using any suitable storage element, e.g., a counter or a register, that is synchronized to the clock of the relevant domain.

A PUSH signal received via the write interface causes the data path to write the received data to the tail of memory buffer 40, as indicated by Wptr, using a decoder 52, and to increment Wptr to the next write position in the memory buffer. Wptr increments cyclically so that next to writing to the last memory buffer position, Wptr loops back to the first position in the memory buffer. In response to a reset signal to the write domain (as will be described below), Wptr is reset to point to the first position in memory buffer 40.

A POP signal received via the read interface causes the data path to retrieve data from the head of memory buffer 40, as indicated by Rptr, using a multiplexer 56, and to increment Rptr to the next read position in the memory buffer. Rptr increments cyclically so that after the reading from the last memory buffer position, Rptr loops back to the first memory buffer position.

The occupancy of memory buffer 40 may be deduced based on comparing between Wptr and Rptr. To this end, the control logic may transfer Wptr to the read domain and Rptr to the W-domain. In some embodiments, however, the Wptr and Rptr cannot be reliably transferred and synchronized to the opposite clock domain due to metastability issues. In such embodiments, the control logic derives a write indicator 58 (denoted Wvec) from Wptr in the W-domain and transfers the write indicator to the R-domain. Similarly, the control logic derives a read indicator 60 (denoted Rvec) from Rptr in the R-domain and transfers the read indicator to the W-domain. Write indicator 58 is indicative of the Wptr value, whereas read indicator 60 is indicative of the Rptr value.

In some embodiments, control logic 36 derives Wvec from Wptr 44 in the W-domain using an encoder 64A. In an embodiment, for a memory buffer operating as a FIFO of depth N, write indicator 58 comprises a number N of 1-bit storage elements. When data is pushed once into the memory buffer, encoder 64A flips only one binary value of the storage element, e.g., the element indexed by Wptr. As a result, encoder 64A toggles only one of the storage elements in Wvec with each write operation to the memory buffer. In some embodiments, encoder 64A encodes Wptr using an encoding scheme that sequentially toggles one bit at a time, per each write operation. Assuming a write indicator having four 1-bit storage elements, the sequence of values that Wvec undergoes over multiple write operations using this sequential toggle scheme is given by: 0000, 0001, 0011, 0111, 1111, 1110, 1100, 1000, 0000, and so on. Control logic 36 transfers Wvec 58 and synchronizes it to the R-domain using a 2-flop element 68A to produce a signal denoted RWvec.

In some embodiments, control logic 36 derives Rvec 60 from Rptr 48 in the R-domain using an encoder 64B that essentially has the same functionality as encoder 64A. Using, encoder 64B, only a single 1-bit storage element in Rvec toggles per each read operation. Over consecutive read operations, Rvec will undergo the same sequence of values as Wvec does for multiple write operations. Control logic 36 transfers Rvec 60 and synchronizes it to the W-domain using a 2-flop element 68B to produce a signal denoted WRvec.

Note that using the encoding scheme that sequentially toggles one bit at a time as described above is not mandatory, and other encoding schemes that toggle a single bit per write or read operation can also be used. An example such encoding scheme is a Gray code scheme. A circuit for generating an empty indication for the encoding scheme that sequentially toggles one bit at a time, as described above, will be described with reference to FIG. 4A below. An alternative circuit that generates an empty indication for any encoding scheme that toggles a single bit per write or read operation will be described with reference to FIG. 5 below.

In the W-domain, control logic 36 produces a FULL signal 70 for indicating when the memory buffer is full and therefore cannot be written. In the present example, the control logic outputs the FULL signal via the write interface. In some embodiments, the control logic produces FULL signal 70 using a W-comparison logic 72 that compares between Wvec 58 and WRvec (i.e., Rvec 60 transferred and synched to the clock of the W-domain). W-comparison logic 72 causes the FULL signal to indicate that the memory buffer is full when Wvec and WRvec have values indicating that Wptr and Rptr differ from one another by the memory buffer (FIFO) depth.

In the R-domain, control logic 36 produces an EMPTYn signal 74 for indicating when memory buffer 40 is empty and therefore cannot be read. Control logic 36 outputs the EMPTYn signal via the read interface. In some embodiments, control logic 36 first produces an R_EMPTYn signal 76 by comparing between Rvec 60 and RWvec (i.e., the transferred and synched version of Wvec 58) using a R-comparison logic 78. R-comparison logic 78 compares between Rvec and RWvec and causes the R_EMPTYn signal to indicate that the memory buffer is empty when the values of vectors Rvec and RWvec are equal. This indicates that Wptr and Rptr point to the same position in memory buffer 40.

To prevent false empty indications, control logic masks R_EMPTYn signal 76 with a masking signal 80 denoted W_EMPTYn, using a logical AND gate 82. The control logic derives the masking signal W_EMPTYn from a signal W_EMPTYn' 84 generated in the W-domain and synchronized to the R-domain using a 2-flop 68C.

In some embodiments, to generate the masking signal W_EMPTYn, W-comparison logic 72 outputs an empty detection signal 86 that is indicative of the memory buffer becoming empty and that is latched by a storage element 88 to produce W_EMPTYn' signal 84. Circuits for generating the empty detection signal will be described in detail below. Note that W_EMPTYn' signal 84 indicates that the memory buffer is empty also in response to receiving a reset signal in the W-domain.

In some embodiments, control logic 36 receives separate reset signals for the W-domain and R-domain. A logical AND gate 90 receives the separate reset signals and produces a common reset signal that simultaneously resets (i) a 2-flop element 68D in the W-domain to produce a W-domain reset signal 92 denoted W_RESETn, and (ii) a 2-flop element 68E in the R-domain to produce a R-domain reset signal 94 denoted R_RESETn.

Note that since the asynchronous reset signals in the W-domain and the R-domain are combined to a common reset signal using logical AND gate 90, and that the combined reset signal is synchronized separately to each of the clock domains. Therefore, the reset signals W_RESETn 92 and W_RESETn 94 are required to meet backend timing requirements. The backend design determines the physical layout of the W_RESETn and the R_RESETn signals, and typically guaranties that all elements in the W-domain are reset simultaneously and all elements in the R-domain are reset simultaneously (unless specifically designed otherwise). The backend design, however, cannot always guarantee that the W_RESETn and the R_RESETn signals reset their respective domains simultaneously, e.g., due to different layout schemes that result in different propagation delays. When the W_RESETn and R_RESETn are time skewed relative to one another, the Wptr (and Wvec and 2-flop 68B) and Rptr (and Rvec and 2-flop 68A) may be reset at different times, which may result in a false empty indication, as described above.

In the example of domain-crossing circuit 20, an empty status of memory buffer 40 corresponds to a binary value '0' of W_EMPTYn. The signal W_EMPTYn is therefore used for masking the signal R_EMPTYn using a logical AND gate (82). In alternative embodiments, an empty status may correspond to a binary value '1'. In such embodiments, logical AND gate 82 may be replaced with a logical OR gate for the masking operation, and storage elements 88 and 68C are reset to a binary value of '1' (instead of '0' in the present example).

The configuration of domain-crossing circuit 20 shown in FIG. 1 is an example configuration, which is chosen purely for the sake of conceptual clarity. In alternative embodiments, any other suitable domain-crossing circuit configuration can be used.

The different elements of domain-crossing circuit 20 may be implemented using suitable hardware, such as in an Application-Specific Integrated Circuit (ASIC) or Field-Programmable Gate Array (FPGA), or using discrete components. Elements of domain-crossing circuit 20 that are not mandatory for understanding of the disclosed techniques have been omitted from the figure for the sake of clarity.

Preventing False FIFO-Occupancy Indications

Figure 2:
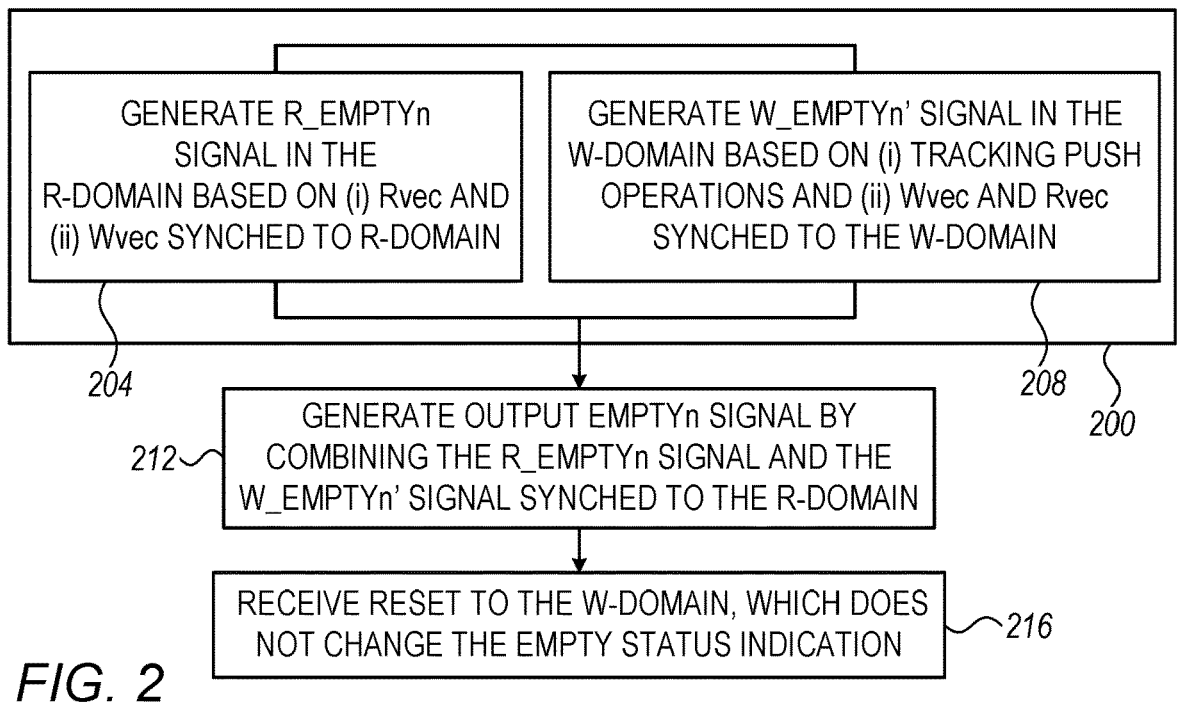
FIG. 2 is a flow chart that schematically illustrates a method for preventing false FIFO-occupancy indications, in accordance with an embodiment that is described herein.

FIG. 2 is a flow chart that schematically illustrates a method for preventing false FIFO-occupancy indications, in accordance with an embodiment that is described herein.

The method is described as executed by control logic 36 of domain-crossing circuit 20 of FIG. 1.

The method begins with control logic 36 generating signals indicative of whether memory buffer 40 is empty or has data to be read, at an empty signal generation step 200. Step 200 is split into two sub-steps 204 and 208 as described herein.

At sub-step 204, the control logic generates R_EMPTYn signal 76 in the R-domain based on Rvec 60 and Wvec 58 synched to the R-domain as described above. At sub-step 208, the control logic generates W_EMPTYn' signal 84 in the W-domain based on (i) tracking push operations to the memory buffer and (ii) Wvec 58, and Rvec 60 synched to the W-domain as described above. The signal W_EMPTYn' indicates an empty status of the memory buffer in response to detecting that all data was read from the memory buffer that consequently has become empty. When the memory buffer had data to read and has become empty due to reading all the data, the empty indication is held by storage element 88 until writing to the memory buffer resumes.

At a signal combining step 212, the W_EMPTYn' signal of sub-step 208 is synched to the R-domain using 2-flop 68C to produce W_EMPTYn signal 80. Logical AND gate 82 combines the R_EMPTYn signal of sub-step 204 and the W_EMPTYn signal 80, to produce the output EMPTYn signal 74.

At a false indication prevention step 216, the W-domain receives a W_RESETn signal 92 that resets storage element 88. The reset operation, however, does not change the states of the W_EMPTYn' and W_EMPTYn signals that continue to indicate that memory buffer 40 is empty. Using logical AND gate 82, the W_EMPTYn signal masks the R_EMPTYn signal and forces an empty status indication by the output EMPTYn signal 74.

Following step 216 the method terminates.

An Example Timing Diagram

Figure 3:
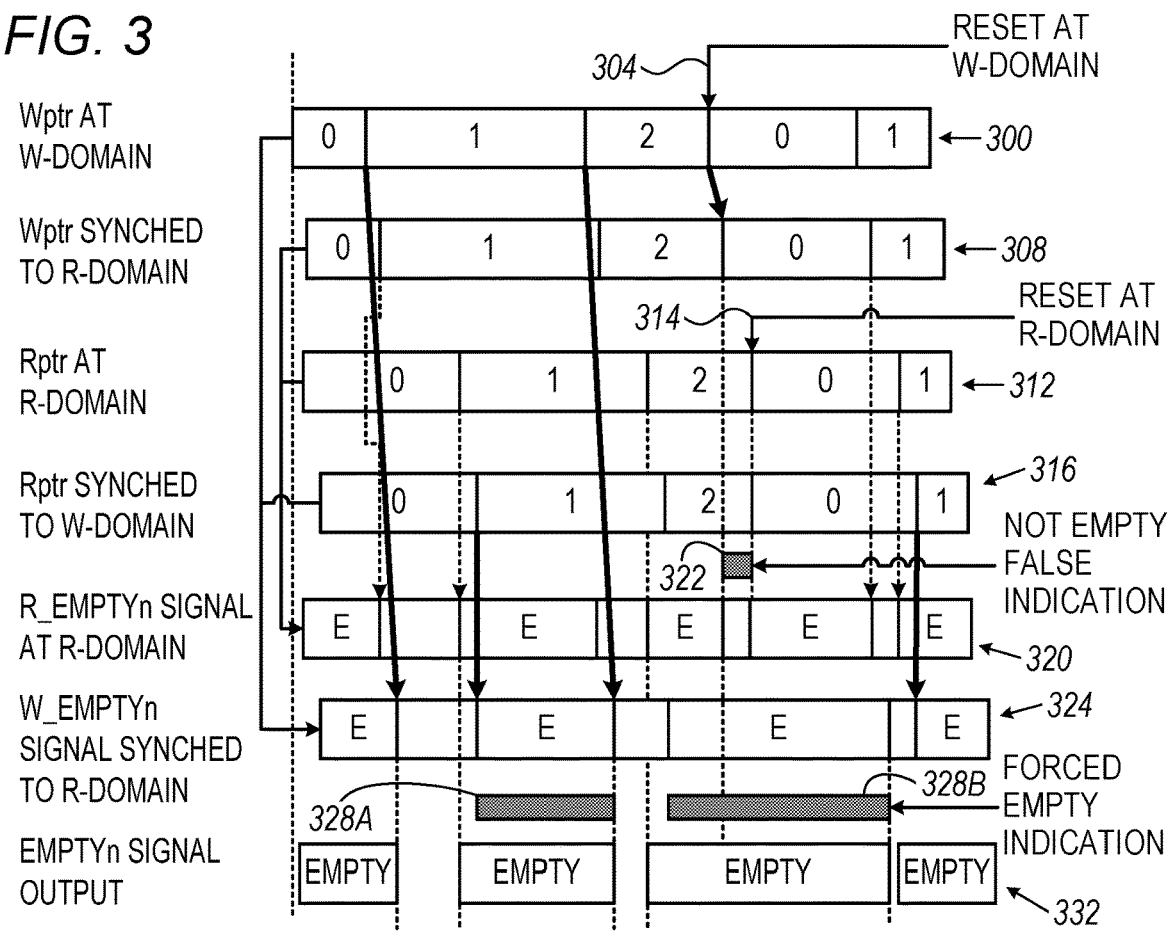
FIG. 3 is a diagram that schematically illustrates various signals in the domain-crossing circuit of FIG. 1, in accordance with an embodiment that is described here.

FIG. 3 is a diagram that schematically illustrates various signals in the domain-crossing circuit of FIG. 1, in accordance with an embodiment that is described here.

In FIG. 3, a Wptr sequence 300 depicts a sequence of positions in memory buffer 40 to which Wptr 44 points during consecutive push operations. In the present example, memory buffer 40 is first written sequentially at memory buffer positions 0, 1 and 2. The Wptr then returns to position 0, in response to receiving a reset signal in the W-domain at instance 304. A synched Wptr sequence 308, depicts a delayed version of sequence 300 corresponding to Wptr synched to the R-domain. Note that even though Wvec 58 is synched to the R-domain, the figure depicts the values of Wptr for convenience.

A Rptr sequence 312 depicts a sequence of positions in memory buffer 40 to which Rptr 48 points during consecutive pop operations. As shown in the figure, Rptr can advance only after Wptr has advanced. A synched Rptr sequence 316, depicts a delayed version of sequence 312 corresponding to Rptr synched to the W-domain. Note that even though Rvec 60 is synched to the W-domain, the figure depicts the values of Rptr for convenience.

In the present example, the R-domain is reset at an instance 314 that occurs later then instance 304 of the W-domain being reset. Consequently, a false indication of the memory buffer occupancy may result, as explained above.

An R_EMPTYn sequence 320 depicts periods marked with the letter "E" during which R_EMPTYn signal 76 indicates that the memory buffer is empty. The "E" periods correspond to periods during which the values in sequences 308 and 312 are equal. Note that during period 322, the value in sequence 308 (corresponding to Wptr) is 0 but the value in sequence 312 (corresponding to Rptr) is still 2. As a result, the R_EMPTYn signal falsely indicates that the memory buffer is not empty.

A W_EMPTYn sequence 324 depicts periods marked with the letter "E" during which the W_EMPTYn signal 80 indicates that memory buffer 40 is empty. The "E" periods correspond to periods starting with pushing data to the memory buffer and popping all written data.

Signals 328A and 328B indicate forced empty indications. As shown in the figure, the reset signal at instance 304 causes an empty indication 328B (by resetting storage element 88), which does not change the W_EMPTYn signal that is already a low level. Note that in the present example, when empty indication 328B starts, W_EMPTYn already indicates an empty status. The empty indication 328B continues until writing to the memory buffer resumes. The behavior of the W_EMPTYn signal under reset of the W-domain does not interfere with data transfer from the W-domain to the R-domain when the domains are operable.

Output EMPTYn signal 332 depicts time periods during which the signal indicates that the memory buffer is empty. This occurs when at least one of signals 320 and the forced empty indication indicates an empty status.

Circuits for Generating an Empty Indication

Figure 4A:
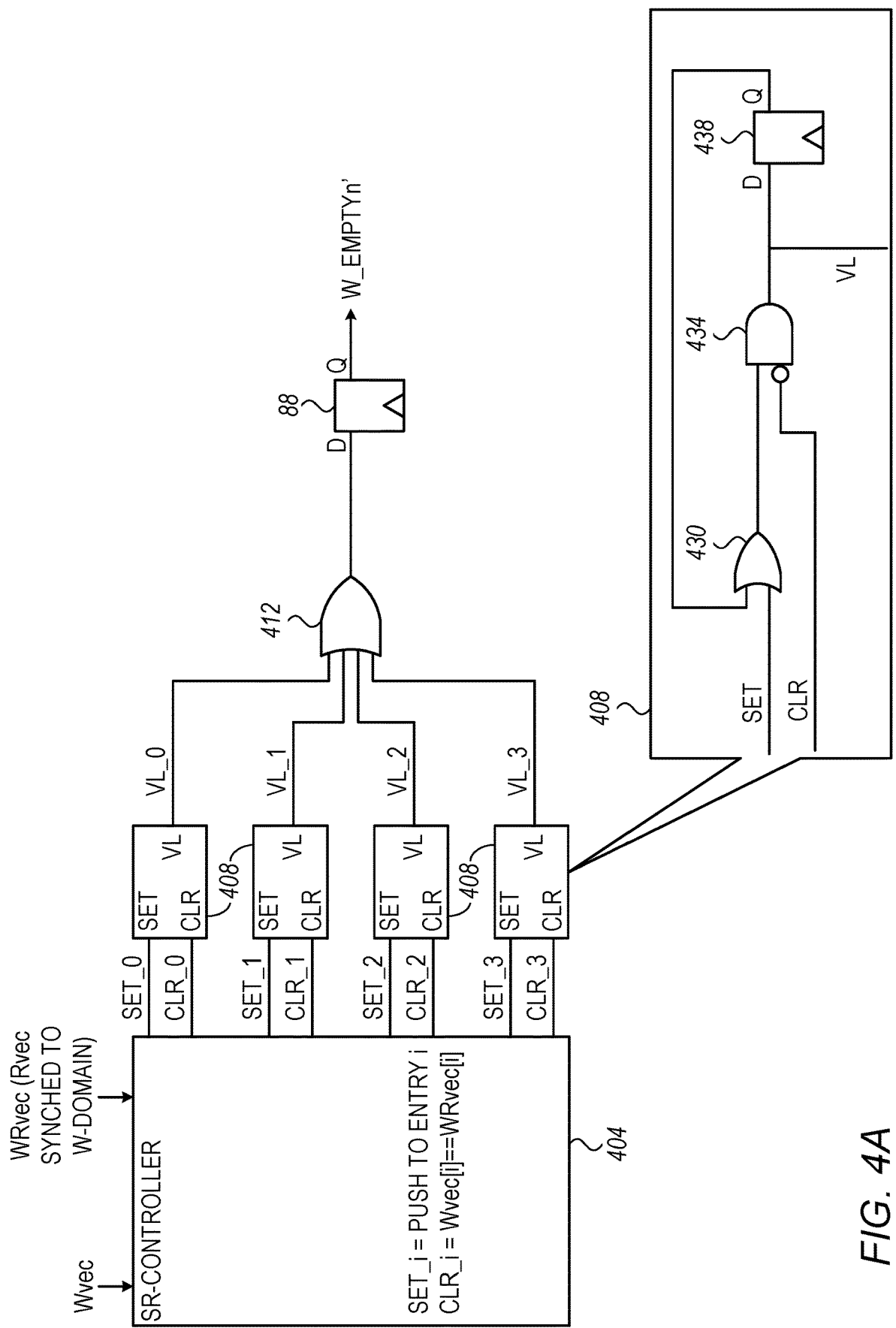
FIG. 4A is a block diagram that schematically illustrates a circuit that generates an empty indication in the W-domain, in accordance with an embodiment that is described herein.

FIG. 4A is a block diagram that schematically illustrates a circuit that generates an empty indication in the W-domain, in accordance with an embodiment that is described herein. Circuit 400 may be used in implementing part of W-comparison logic 72 of FIG. 1. Circuit 400 can be used in embodiments in which encoders 64A and 64B implement the sequential toggle scheme described above.

Circuit 400 comprises a SR-controller 404 that controls multiple SET/RESET (SR)—Flip-Flops (FFs) 408. The number of SR-FFs equals the number of entries in memory buffer 40. SR-controller 400 produces SET_i and CLR_i signals for setting and clearing the VL_i output of each $i^{th}$ SR-FF. The SR controller sets VL_i to binary value '1' in response to pushing data to the $i^{th}$ entry of memory buffer 40. The SR controller clears VL_i in response to detecting that Wvec[i] equals WRvec[i], wherein Wvec[i] is the $i^{th}$ element of Wvec 58 and WRvec[i] is the $i^{th}$ element of Rvec 60 synchronized to the W-domain using 2-flop element 68B.

When any of the VL_i outputs equals binary value '1', the corresponding entry in the memory buffer has not been popped yet. When all the VL_i outputs equal '0', all the memory buffer entries that were pushed with data were also popped, which means that the memory buffer has become empty. A logical OR gate 412 applies a logical OR operation among the VL_i outputs and the output of the logical OR gate is latched by storage element 88 to produce the W_EMPTYn' indication.

The detailed block diagram of SR-FF 408 is now described. SR-FF 408 comprises a logical OR gate 430, a logical AND gate 434 having an inverted input, and a storage element 438. When both the SET and CLR inputs equal a binary '0' value the output of the SR-FF is unmodified. When the SET input temporarily changes to '1', the SR-FF latches a '1' value in storage element 438. The VL output thus holds a '1' value until the SR-FF receives a CLR signal. When the CLR input changes to binary '1' temporarily, storage element 438 latches a value '0'. The SR-FF retains the '0' until the SET input changes from '0' to '1' again.

Figure 4B:
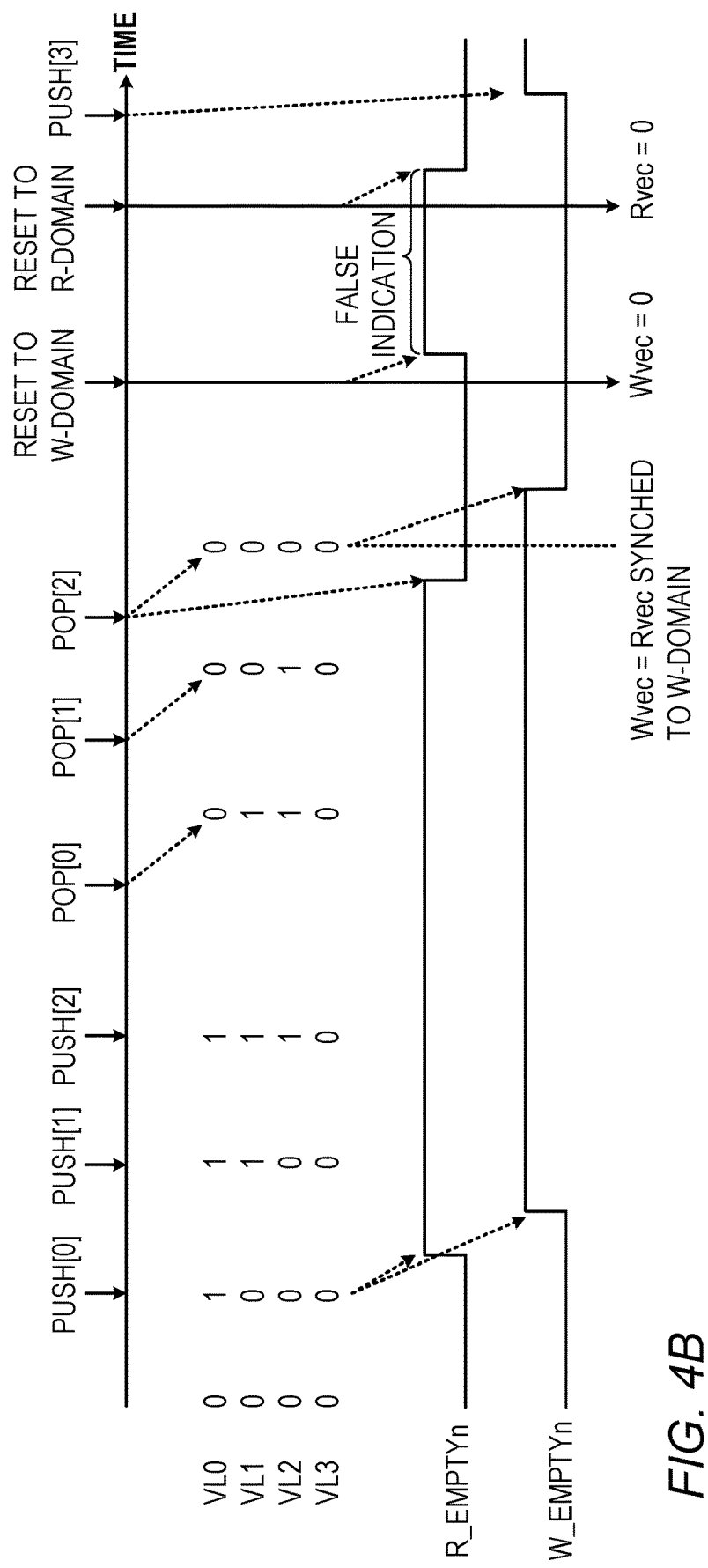
FIG. 4B is a diagram that schematically illustrates timing relationships among signals in the circuit of FIG. 4A, in accordance with an embodiment that is described herein.

FIG. 4B is a diagram that schematically illustrates timing relationships among signals in the circuit of FIG. 4A, in accordance with an embodiment that is described herein.

FIG. 4B depicts the values of VL0 . . . VL3, and derived signals over time. As shown in the figure, applying a PUSH operation to the $i^{th}$ entry sets the corresponding VL_i to a value '1', and a POP from the $i^{th}$ entry clears VL_i to a value '0'.

Initially, VL_0 . . . VL_3 are all cleared to value '0'. The PUSH[0] operation causes R_EMPTYn signal in the R-domain to a value '1', indicating that the memory buffer is not empty. Setting VL_0 to '1' also causes setting W_EMPTYn signal to a value '1' via OR gate 412, storage element 88 and 2-flop element 68C.

In the present example, the memory buffer is subjected to three PUSH operations followed by three POP operations. The third POP operation denoted POP[2] empties the memory buffer, which forces R_EMPTYn and VL_2 to '0'. Since at this point all VL_0 . . . VL_3 are cleared to '0', W_EMPTYn is also cleared to value '0'. The W_EMPTYn signal forces an empty indication until applying another PUSH operation (PUSH[3]).

FIG. 4B depicts a reset to the W-domain followed by a reset to the R-domain. As described above, a time skew between the reset signals may result in a false indication that the memory buffer is not empty. Upon the PUSH[3] operation, the empty indication by W_EMPTYn terminates because VL3 changes to '1' (not shown).

Figure 5:
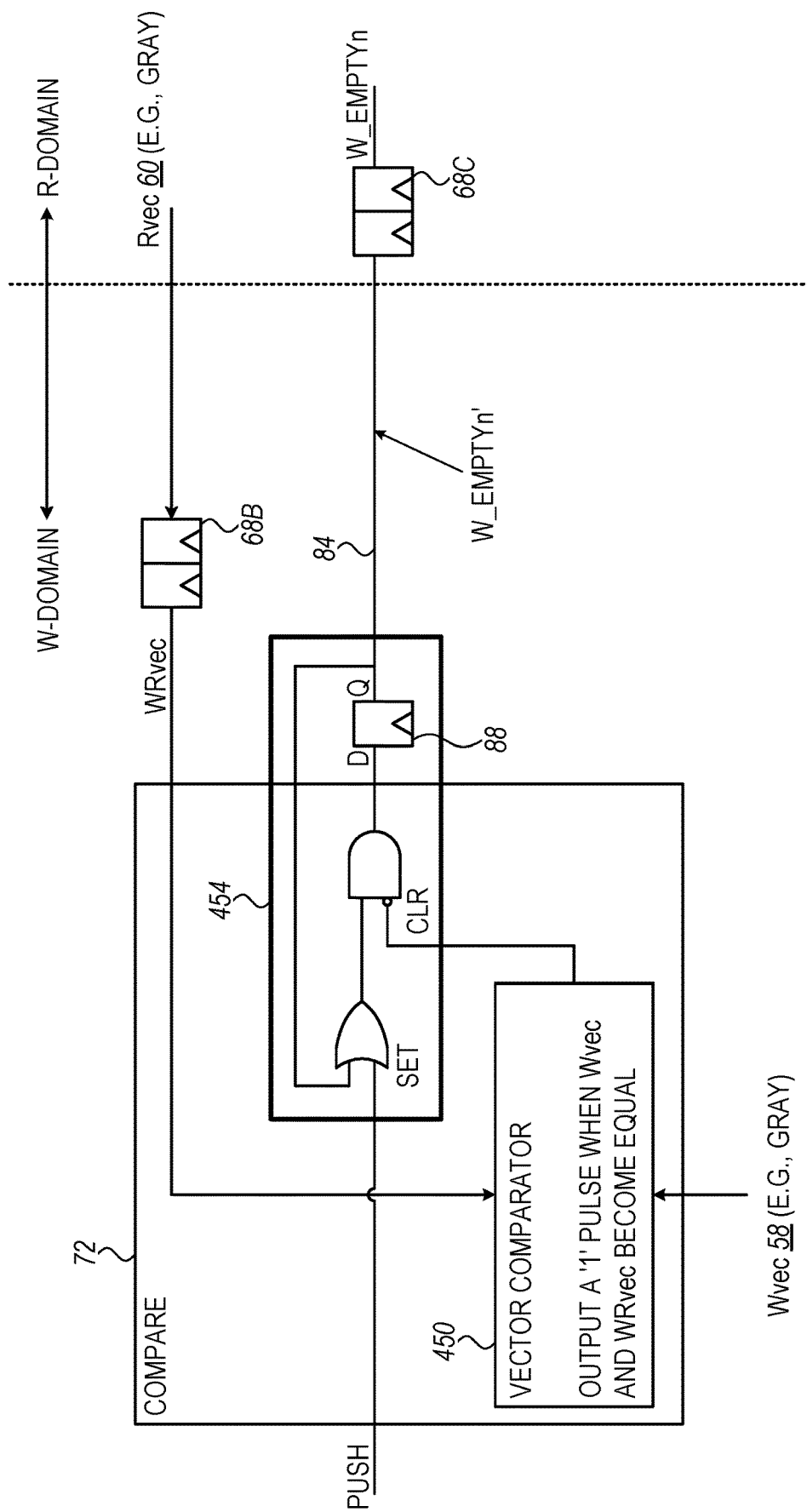
FIG. 5 is a block diagram that schematically illustrates a circuit that generates an empty indication in the W-domain, in accordance with another embodiment that is described herein.

FIG. 5 is a block diagram that schematically illustrates a circuit that generates an empty indication in the W-domain, in accordance with another embodiment that is described herein.

FIG. 5 depicts several elements of control logic 36 of FIG. 1, including W-comparison logic 72 that receives (i) Wvec 58 of the W-domain, and (ii) WRvec that is generated from Rvec 60 of the R-domain by synching Rvec 60 to the W-domain using 2-flop 68B.

W-comparison logic 72 comprises a vector comparator 450, and part of the logic comprised in a SR-FF 454 that has the same functionality of SR-FF 408 of FIG. 4A. Vector comparator 450 compares between corresponding elements of Wvec and WRvec. The vector comparator normally outputs a binary logical '0' value, and temporarily outputs a pulse of a binary logical '1' value after reset or in response to detecting that all the elements of Wvec and Rvec have become equal.

SR-FF 454 receives the PUSH signal at its SET input and the output of the vector comparator at its CLR input. The '1' pulse of the vector comparator forces W_EMPTYn' signal 84 (output by storage element 88) to a logical value '0', indicating that the memory buffer has become empty. A PUSH signal then forces the W_EMPTYn' signal to a logical '1' value indicating that the memory buffer is not empty. Additional PUSH operations do not change this "not empty" indication.

After applying one or more PUSH operations followed by a same number of POP operations, Wvec and Rvec become equal, and consequently the vector comparator issues a '1' pulse that forces the W_EMPTYn' to '0', indicating that the memory buffer has become empty. The empty indication persists until applying another PUSH operation to the memory buffer.

In general, the circuit of FIG. 5 may be used with any encoding scheme of encoders 64A and 64B that toggles only one of the storage elements in Wvec with each push operation to the memory buffer. One example of such encoding scheme is based on encoding Wptr and Rptr using a Gray code.

Although the embodiments described herein mainly address circuits for mediating between asynchronous clock domains, the methods and systems described herein can also be used in other applications, such as in pulse synchronization.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic circuit, comprising:
   a memory buffer configured to transfer data from a first domain of the circuit to a second domain of the circuit, wherein the first and the second domains operate in synchronization with respective first and second clock signals; and
   control logic, configured to:
      maintain a write indicator in the first domain indicative of a next write position in the memory buffer for storing data;
      maintain a read indicator in the second domain indicative of a next read position in the memory buffer for retrieving the stored data;
      generate in the second domain, based at least on the write indicator and on the read indicator, a first signal that is indicative of whether the memory buffer has data for reading or has become empty;
      generate in the second domain, a second signal that falsely indicates that the memory buffer is not empty, and mask the second signal using the first signal; and
      retain the first signal in a state that indicates that the memory buffer has become empty, until writing to the memory buffer resumes.

2. The electronic circuit according to claim 1, wherein the control logic is configured to retain the first signal in the state that indicates that the memory buffer has become empty, regardless of a first event comprising resetting the first domain including the write indicator and of a second event comprising resetting the second domain including the read indicator.

3. The electronic circuit according to claim 1, wherein the control logic is configured to prevent a false indication of the first signal that the memory buffer is not empty even when the memory buffer is actually empty.

4. The electronic circuit according to claim 3, wherein the control logic is configured to prevent the false indication regardless of any backend design considerations in determining a physical layout of reset signals in the electronic circuit.

5. The electronic circuit according to claim 3, wherein the control logic is configured to prevent the false indication by resetting both the first domain and the second domain simultaneously.

6. The electronic circuit according to claim 5, wherein the control logic is configured to prevent the false indication regardless of a timing skew between a first time of actual resetting of the first domain and a second time of actual resetting of the second domain.

7. The electronic circuit according to claim 1, wherein the control logic is configured to generate the first signal using a storage element in the first domain, by forcing the storage element to a state indicative of the memory buffer being empty, in response to resetting the first domain, and determining a state of the storage element when the first domain is operative, based on (i) tracking write operations to the memory buffer, and (ii) the write indicator and the read indicator.

8. The electronic circuit according to claim 1, wherein the read indicator comprises multiple binary storage elements, and wherein the control logic is configured to toggle only one of the binary storage elements in response to a read operation from the memory buffer.

9. The electronic circuit according to claim 1, wherein the write indicator comprises multiple binary storage elements, and wherein the control logic is configured to toggle only one of the binary storage elements in response to a write operation to the memory buffer.

10. The electronic circuit according to claim 1, wherein the first clock signal and the second clock signal are asynchronous relative to one another.

11. A method, comprising:
    in an electronic circuit that transfers data from a first domain of the circuit to a second domain of the circuit using a memory buffer, wherein the first and the second domains operate in synchronization with respective first and second clock signals,
    maintaining in the first domain a write indicator indicative of a next write position in the memory buffer for storing data;
    maintaining in the second domain a read indicator indicative of a next read position in the memory buffer for retrieving the stored data;
    generating in the second domain, based at least on the write indicator and on the read indicator, a first signal that is indicative of whether the memory buffer has data for reading or has become empty;
    generating in the second domain, a second signal that falsely indicates that the memory buffer is not empty, and masking the second signal using the first signal; and
    retaining the first signal in a state that indicates that the memory buffer has become empty, until writing to the memory buffer resumes.

12. The method according to claim 11, wherein retaining the first signal comprises retaining the first signal in the state that indicates that the memory buffer has become empty, regardless of a first event comprising resetting the first domain including the write indicator and of a second event comprising resetting the second domain including the read indicator.

13. The method according to claim 11, and comprising preventing a false indication of the first signal that the memory buffer is not empty even when the memory buffer is actually empty.

14. The method according to claim 13, wherein preventing the false indication comprises preventing the false indication regardless of any backend design considerations in determining a physical layout of reset signals in the electronic circuit.

15. The method according to claim 13, wherein preventing the false indication comprises resetting both the first domain and the second domain simultaneously.

16. The method according to claim 15, wherein preventing the false indication comprises preventing the false indication regardless of a timing skew between a first time of actual resetting of the first domain and a second time of actual resetting of the second domain.

17. The method according to claim 11, wherein generating the first signal comprises forcing a storage element in the first domain to a state indicative of the memory buffer being empty in response to resetting the first domain, and determining a state of the storage element when the first domain is operative, based on (i) tracking write operations to the memory buffer, and (ii) the write indicator and the read indicator.

18. The method according to claim 11, wherein the read indicator comprises multiple binary storage elements, and comprising toggling only one of the binary storage elements in response to a read operation from the memory buffer.

19. The method according to claim 11, wherein the write indicator comprises multiple binary storage elements, and wherein the control logic is configured to toggle only one of the binary storage elements in response to a write operation to the memory buffer.

20. The method according to claim 11, wherein the first clock signal and the second clock signal are asynchronous relative to one another.

21. An electronic circuit, comprising:
a memory buffer configured to transfer data from a first domain of the circuit to a second domain of the circuit, wherein the first and the second domains operate in synchronization with respective first and second clock signals; and
control logic, configured to:
    maintain a write indicator in the first domain indicative of a next write position in the memory buffer for storing data;
    maintain a read indicator in the second domain indicative of a next read position in the memory buffer for retrieving the stored data;
    generate in the second domain, a first signal that is indicative of whether the memory buffer has data for reading or has become empty, by forcing the storage element to a state indicative of the memory buffer being empty, in response to resetting the first domain, and determining a state of the storage element when the first domain is operative, based on (i) tracking write operations to the memory buffer, and (ii) the write indicator and the read indicator; and
    retain the first signal in a state that indicates that the memory buffer has become empty, until writing to the memory buffer resumes.

22. A method, comprising:
in an electronic circuit that transfers data from a first domain of the circuit to a second domain of the circuit using a memory buffer, wherein the first and the second domains operate in synchronization with respective first and second clock signals,
maintaining in the first domain a write indicator indicative of a next write position in the memory buffer for storing data;
maintaining in the second domain a read indicator indicative of a next read position in the memory buffer for retrieving the stored data;
generating in the second domain, using a storage element in the first domain, a first signal that is indicative of whether the memory buffer has data for reading or has become empty, by forcing the storage element to a state indicative of the memory buffer being empty, in response to resetting the first domain, and determining a state of the storage element when the first domain is operative, based on (i) tracking write operations to the memory buffer, and (ii) the write indicator and the read indicator; and
retaining the first signal in a state that indicates that the memory buffer has become empty, until writing to the memory buffer resumes.

23. An electronic circuit, comprising:
a memory buffer configured to transfer data from a first domain of the circuit to a second domain of the circuit, wherein the first and the second domains operate in synchronization with respective first and second clock signals; and
control logic, configured to:
    maintain a write indicator in the first domain indicative of a next write position in the memory buffer for storing data;
    maintain a read indicator in the second domain indicative of a next read position in the memory buffer for retrieving the stored data, the read indicator comprising multiple binary storage elements, and toggle only one of the binary storage elements in response to a read operation from the memory buffer;
    generate in the second domain, based at least on the write indicator and on the read indicator, a first signal that is indicative of whether the memory buffer has data for reading or has become empty; and
    retain the first signal in a state that indicates that the memory buffer has become empty, until writing to the memory buffer resumes.

24. A method, comprising:
in an electronic circuit that transfers data from a first domain of the circuit to a second domain of the circuit using a memory buffer, wherein the first and the second domains operate in synchronization with respective first and second clock signals,
maintaining in the first domain a write indicator indicative of a next write position in the memory buffer for storing data;
maintaining in the second domain a read indicator indicative of a next read position in the memory buffer for retrieving the stored data, the read indicator comprising multiple binary storage elements, and toggling only one of the binary storage elements in response to a read operation from the memory buffer;
generating in the second domain, based at least on the write indicator and on the read indicator, a first signal that is indicative of whether the memory buffer has data for reading or has become empty; and retaining the first signal in a state that indicates that the memory buffer has become empty, until writing to the memory buffer resumes.

25. An electronic circuit, comprising:

a memory buffer configured to transfer data from a first domain of the circuit to a second domain of the circuit, wherein the first and the second domains operate in synchronization with respective first and second clock signals; and control logic, configured to:
  maintain a write indicator in the first domain indicative of a next write position in the memory buffer for storing data, the write indicator comprising multiple binary storage elements, and toggle only one of the binary storage elements in response to a write operation to the memory buffer;
  maintain a read indicator in the second domain indicative of a next read position in the memory buffer for retrieving the stored data;
  generate in the second domain, based at least on the write indicator and on the read indicator, a first signal that is indicative of whether the memory buffer has data for reading or has become empty; and
  retain the first signal in a state that indicates that the memory buffer has become empty, until writing to the memory buffer resumes.

26. A method, comprising:

in an electronic circuit that transfers data from a first domain of the circuit to a second domain of the circuit using a memory buffer, wherein the first and the second domains operate in synchronization with respective first and second clock signals, maintaining in the first domain a write indicator indicative of a next write position in the memory buffer for storing data, the write indicator comprising multiple binary storage elements, and toggling only one of the binary storage elements in response to a write operation to the memory buffer;

maintaining in the second domain a read indicator indicative of a next read position in the memory buffer for retrieving the stored data;

generating in the second domain, based at least on the write indicator and on the read indicator, a first signal that is indicative of whether the memory buffer has data for reading or has become empty; and retaining the first signal in a state that indicates that the memory buffer has become empty, until writing to the memory buffer resumes.

* * * * *